United States Patent [19]

Morgan

[11] Patent Number: 5,732,031
[45] Date of Patent: Mar. 24, 1998

[54] ADDRESS COMPARING FOR NON-PRECHARGED REDUNDANCY ADDRESS MATCHING WITH REDUNDANCY DISABLE MODE

[75] Inventor: Donald M. Morgan, Boise, Id.

[73] Assignee: Micron Technology, Inc., Boise, Id.

[21] Appl. No.: 709,162

[22] Filed: Sep. 6, 1996

Related U.S. Application Data

[63] Continuation-in-part of Ser. No. 501,212, Jul. 11, 1995, Pat. No. 5,574,689.
[51] Int. Cl.⁶ ................................................ G11C 8/00
[52] U.S. Cl. ................... 365/200; 365/230.06; 365/225.7
[58] Field of Search ........................... 365/200, 230.06, 365/225.7

[56] References Cited

U.S. PATENT DOCUMENTS

| | | | |
|---|---|---|---|
| 5,281,868 | 1/1994 | Morgan | 307/441 |
| 5,427,040 | 6/1995 | Sokegawa et al. | 365/230 |
| 5,495,446 | 2/1996 | Teel et al. | 365/200 |
| 5,508,963 | 4/1996 | Sawada et al. | 365/725 |

FOREIGN PATENT DOCUMENTS

| | | |
|---|---|---|
| 0290094 | 11/1988 | European Pat. Off. . |
| 0376245 | 7/1990 | European Pat. Off. . |
| 0554052 | 8/1993 | European Pat. Off. . |

OTHER PUBLICATIONS

Abstract to Japanese Kokai 3-283,196 published Mar. 19, 1992.

*Primary Examiner*—Joseph E. Clawson, Jr.
*Attorney, Agent, or Firm*—Schwegman, Lundberg, Woessner & Kluth, P.A.

[57] ABSTRACT

An integrated circuit includes primary circuit elements selectable by n address bits. A master storage device is programmable to indicate that at least one primary circuit element is being replaced. Redundant circuit elements each include a non-precharging matching circuit, which includes sub-match circuits. The sub-match circuits include two state storage devices corresponding to one of the possible binary values of at least one of the n address bits and activate a sub-match signal when the binary value of the at least one of the n address bits corresponds to one of the two state storage devices in a first state if the master storage device is programmed. A match circuit activates a match signal in response to all sub-match signals being active to disable a primary circuit element from being selected by a corresponding binary value of the n address bits and to enable the redundant circuit element to be selected by the corresponding binary value of the n address bits. In one form of the integrated circuit, each sub-match circuit includes redundancy disable circuitry responsive to a redundancy control signal being in a first state to deactivate an activated sub-match signal.

20 Claims, 12 Drawing Sheets

ADDRESS COMPARING FOR NON-PRECHARGED REDUNDANCY ADDRESS MATCHING WITH REDUNDANCY DISABLE MODE

This application is a continuation-in-part of application Ser. No. 08/501,212, filed Jul. 11, 1995, now U.S. Pat. No. 5,574,689 entitled "Address Comparing for Non-Precharged Redundancy Address Matching."

THE FIELD OF THE INVENTION

The present invention relates generally to integrated circuits, and more particularly to address compare schemes used to replace primary circuit elements with redundant circuit elements in memory integrated circuits, such as dynamic random access memories, static random access memories, video random access memories, and erasable programmable read only memories.

BACKGROUND OF THE INVENTION

Technological advances have permitted semiconductor integrated circuits to comprise significantly more circuit elements in a given silicon area. Reducing and eliminating defects in the circuit elements has, however, become increasingly more difficult with the increased number of circuit elements. To achieve higher population capacities, circuit designers strive to reduce the size of the individual circuit elements to maximize available die real estate. The reduced size makes these circuit elements increasingly susceptible to defects caused by material impurities during fabrication. Nevertheless, the defects are identifiable upon completion of the integrated circuit fabrication by testing procedures, either at the semiconductor chip level or after complete packaging. Scrapping or discarding defective integrated circuits when defects are identified is economically undesirable, particularly if only a small number of circuit elements are actually defective.

Relying on zero defects in the fabrication of integrated circuits is an unrealistic option. Therefore, redundant circuit elements are provided on integrated circuits to reduce the number of scrapped integrated circuits. If a primary circuit element is determined to be defective, a redundant circuit element is substituted for the defective primary circuit element. Substantial reductions in scrap are achieved by using redundant circuit elements without substantially increasing the cost of the integrated circuit.

One type of integrated circuit device which uses redundant circuit elements is integrated memory circuits, such as dynamic random access memories (DRAMs), static random access memories (SRAMs), video random access memories (VRAMs), and erasable programmable read only memories (EPROMs). Typical integrated memory circuits comprise millions of equivalent memory cells arranged in arrays of addressable rows and columns. The rows and columns of memory cells are the primary circuit elements of the integrated memory circuit. By providing redundant circuit elements, either as rows or columns, defective primary rows or columns can be replaced.

Because the individual primary circuit elements (rows or columns) of an integrated memory circuit are separately addressable, replacing a defective circuit element typically comprises blowing fuse-type circuits to "program" a redundant circuit element to respond to the address of the defective primary circuit element. This process is very effective for permanently replacing defective primary circuit elements.

In the case of DRAMs, for example, a particular memory cell is selected by first providing a unique row address of the row in which the particular memory cell is located and subsequently providing a unique column address of the column in which the particular memory cell is located. Redundancy circuitry must recognize the address of the effective primary circuit element and reroute all signals to the redundant circuit element when the address to the defective primary circuit element is presented by the user. Therefore, a number of fuses are associated with each redundant circuit element. The possible combinations of blown and unblown fuses corresponding to each redundant circuit element represent unique addresses of all primary circuit elements for which a corresponding redundant circuit element may be substituted.

During testing of the DRAM at the factory, any defective primary circuit elements are identified. A suitable redundant circuit element is selected, and the corresponding fuses are blown in a predetermined order to represent the address of the defective primary circuit element to be replaced. When using the DRAM, each address provided to the DRAM must be compared to the corresponding fuses to determine if a redundant match is present. Whenever the redundant match is detected, the primary circuit element is suppressed and the redundant circuit element is activated to perform the required function. Since each row or column on a DRAM is selected by one of $2^n$ binary combinations of high and low states on n address inputs, the compare of addresses to the fuses must compare all n address inputs to the combination of blown and unblown fuses to determine if a redundant match exists.

Various techniques have previously been utilized to facilitate the address/fuse compare. As will be apparent from the prior art discussion in the following detailed description of the preferred embodiments, the prior techniques have suffered from a variety of problems. Some previous address/fuse compare circuits occupy excessive silicon area and require excessive fanin into an overall match comparator circuit, which combines individual bit compares between portions of the address bits and the corresponding fuses. Other previous address/fuse compare circuits precharge a precharge node in the compare circuit to reduce silicon area and fanin, but the time required to precharge the precharge node prevents real time compares from occurring. Thus, an improved address/fuse compare scheme is needed for non-precharged redundancy address matching which causes a redundant circuit element to respond to the address of the defective primary circuit element.

SUMMARY OF THE INVENTION

The present invention provides an integrated circuit receiving n address bits and including primary circuit elements being selectable by binary values of the n address bits. A programmable master storage device stores and provides a programmable master condition which when active indicates that at least one primary circuit element is being replaced. The integrated circuit also includes redundant circuit elements, with each having a corresponding matching circuit. Each matching circuit includes a plurality of sub-match circuits. Each sub-match circuit includes programmable two state storage devices, which are programmable to a programmed state. In the programmed state one of the two state storage devices is in a first of the two states and the rest of the two state storage devices are in a second of the two states. Each two state storage device corresponds to one of the possible binary values of at least one of the n address bits. Each sub-match circuit is responsive to the master condition and a binary value of the at least one of the n address inputs to activate a sub-match signal when the binary value of the at least one of the n address bits corresponds to the one of the two state storage devices in the first state and the master condition is active. Each sub-match circuit includes redundancy disable circuitry responsive to a redundancy control signal being in a first state to deactivate an activated sub-match signal. A match circuit is coupled to the plurality of sub-match circuits for activating a match signal in response to all of the sub-match signals being active. The activated match signal is used to disable a primary circuit element from being selected by a corresponding binary value of the n address bits and to enable the redundant circuit element to be selected by the corresponding binary value of the n address bits.

The redundancy control signal is preferably controllable from external to the integrated circuit to permit a user of the integrated circuit according to the present invention to deactivate the match signal to prevent access by the associated redundant circuit element. This redundancy disable feature permits the user of the integrated circuit according to the present invention to disable redundancy in certain test modes; when it is determined that the redundant circuit element is not functioning properly; or for any other suitable reason. In one embodiment, the state of the redundancy control signal defaults to a low logic level and is temporarily forced to a high logic level during testing, or is permanently forced to a high logic level by blowing a fuse.

The two state storage devices are preferably implemented as laser fuses, but can be implemented by any fuse or static containing device. In addition, the programmable master storage device preferably comprises a fuse, and optionally comprises a second fuse coupled in series with the first fuse.

Each of the sub-match circuits preferably responds to the master condition being inactive to force the sub-match signals inactive. In one embodiment of the present invention, each sub-match circuit receives a predecoded form of at least two of the n address bits. In another embodiment of the present invention, each sub-match circuit directly receives a true address bit and its compliment address bit.

In one embodiment of the present invention, the integrated circuit is a dynamic random access memory (DRAM) comprising an array of memory cells arranged in rows and columns. In this embodiment, the primary circuit elements comprise rows and columns of memory cells.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM). The present invention is not limited to DRAMs, as the present invention is equally applied to other memory devices such as static random access memories (SRAMs), video random access memories (VRAMs), and erasable programmable read only memories (EPROMs). In fact, the present invention can be applied to any electronic integrated circuit having primary and redundant circuitry comprising separately addressable circuit elements.

Example DRAM Configuration

Figure 1C:
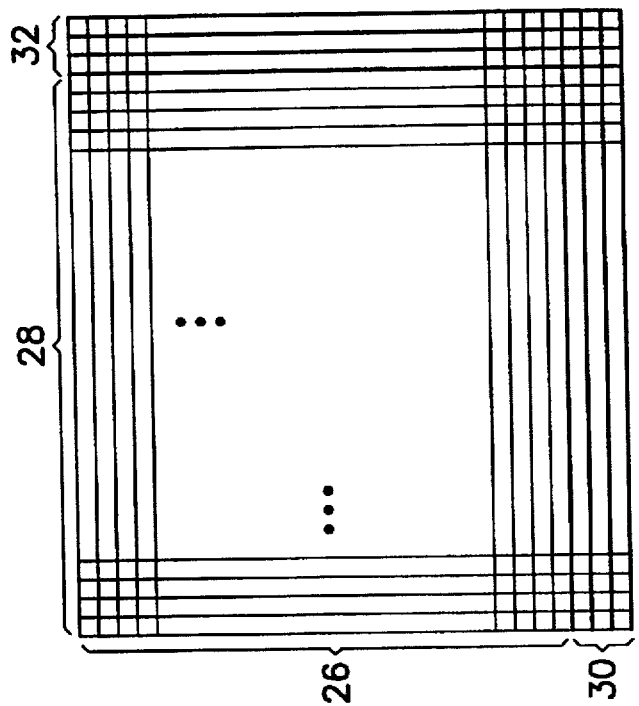
FIGS. 1A–1C are illustrations of a suitable configuration of a 64 megabit DRAM having redundancy circuitry according to the present invention.
Figure 1B:
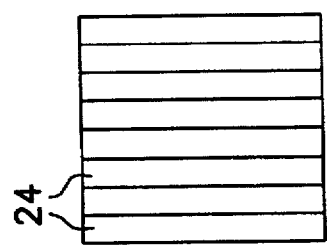
Figure 1A:
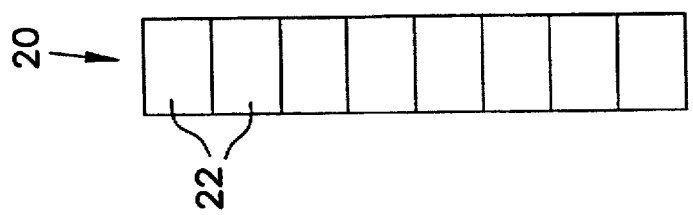

Addressable memory cells of a 64 megabit DRAM according to the present invention are illustrated generally at 20 in FIG. 1A. The 64 megabit DRAM according to the present invention is similar in many respects to conventional DRAMs, such as those commercially available from Micron Technology Inc. of Boise, Id. For clarity, only a portion of the well known circuitry of the DRAM is described herein, while the new circuitry of the DRAM of the present invention is described in detail herein. As illustrated in FIG. 1A, the 64 megabit DRAM includes eight sections 22. As illustrated in FIG. 1B, each section 22 includes eight subsections or arrays 24. As illustrated in FIG. 1C, each array 24 includes one megabit of memory cells arranged in 512 addressable primary rows or circuit elements 26 and 2048 addressable primary columns or circuit elements 28.

In addition, in the embodiment of the 64 megabit DRAM according to the present invention illustrated in FIGS. 1A–1C, each array 24 includes four addressable redundant rows or circuit elements 30 and four addressable redundant columns or circuit elements 32. Four redundant rows and four redundant columns are shown in FIG. 1C for illustrative purposes only, and the exact number of redundant circuit elements included in a DRAM or other integrated circuit according to the present invention is determined based on known design criteria.

Each primary row 26 is uniquely addressable. Thus, any one of the primary rows 26 in the DRAM can be addressed using twelve address lines (i.e., nine address lines corresponding to the 512 primary rows 26 and three address lines corresponding to the eight sections 22). If testing procedures indicate that a primary row is defective, a redundant row 30 is "programmed" to replace the defective primary row 26. This is accomplished by programming a redundant row 30 to respond to the address corresponding to the defective primary row 26.

Each primary column 28 is also uniquely addressable. Thus, any one of the primary columns 28 in the DRAM can be addressed using fourteen address lines (i.e., eleven address lines corresponding to the 2048 primary columns 28 and three address lines corresponding to the eight arrays 24). If testing procedures indicate that a primary column is defective, a redundant column 32 is "programmed" to replace the defective primary column 28. This is accomplished by programming a redundant column 32 to respond to the address corresponding to the defective primary column 28.

Figure 2:
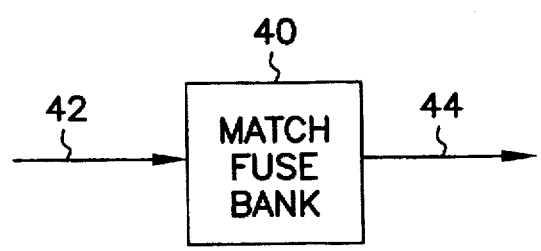
FIG. 2 is a block diagram of match fuse bank circuit according to the present invention, which is employed in the DRAM partially illustrated in FIGS. 1A–1C.

Referring to FIG. 2, each of the four redundant rows 30 and each of the four redundant columns 32 of each array 24 includes a corresponding multi-bit address/fuse comparison circuit module or match fuse bank circuit 40 according to the present invention. Each match fuse bank circuit 40 is capable of receiving a multi-bit address signal, indicated at 42, in the form of a pre-decoded signal or a non-predecoded signal depending on the embodiment of the match fuse bank. The address signal 42 is used to address the primary rows 26 at one time and the primary columns at a subsequent time based on the state of selected command input signals to the DRAM. Each match fuse bank circuit 40 is selectively programmable to respond to a specific value of the address signal 42. Each match fuse bank circuit 40 evaluates the address signal 42 and activates a match signal, indicated at 44, if the row address value of address signal 42 corresponds to the address of a defective primary row 26 which the match fuse bank circuit is programmed to replace. Similarly, each match fuse bank circuit 40 activates the match signal 44 if the column address value of address signal 42 corresponds to the address of a defective primary column 28 which the match fuse bank circuit is programmed to replace.

The match signal 44, when activated by it corresponding match fuse bank circuit 40, causes the associated redundant row 30 or the associated redundant column 32 to be accessed. The activated match signal 44 also disables the associated defective primary row 26 or the associated primary column 28 such that the associated defective primary row or column cannot respond to the address signal 42.

Prior Art Non-Precharging Match Fuse Bank Circuit

A better understanding of the operation of match fuse bank circuit 40 according to the present invention is obtained by first providing a description of some representative prior art match fuse bank circuits. For example, a prior art non-precharging match fuse bank circuit 50 is representatively illustrated in FIG. 3. Match fuse bank circuit 50 is illustrated for only eight address bits, A0–A7, for clarity. It will be understood by those skilled in the art that match fuse bank circuit 50 and the other below-described prior art and present invention match fuse banks can be adapted to memories comprising any of a number of primary circuit elements, which can be configured in any suitable arrangement. In addition, the match fuse bank circuit 50 and the other prior art and present invention match fuse bank circuits are representatively illustrated in complementary metal-oxide-semiconductor (CMOS) logical circuits. The present invention, however, is in no way limited to CMOS devices, and can be extended to integrated circuits of any suitable logic family.

Prior art match fuse bank circuit 50 comprises eight sub-match circuits 52, each receiving one of the address input bits A0–A7. For example, the sub-match circuit 52 corresponding to address input A0 is illustrated in detail in FIG. 3. Each sub-match circuit 52 comprises one fuse 54. The fuses 54 and the other fuses used in the below-described prior art and present invention fuse bank circuits are preferably laser fuses, but can be any fuse or static containing device.

A fuse read latch 56 reads and latches the state of fuse 54 upon powerup of the DRAM. Fuse read latch 56 comprises a p-type transistor 58 and an inverter 60 coupled together in a known manner as shown to read and latch the state of fuse 54 and provide that state on a line 62 as signal f0. Signal f0 on line 62 is high when fuse 54 is not blown, and low when fuse 54 is blown. Fuse read latch 56 also includes an inverter 64 to invert the f0 signal on line 62 to provide a f0* signal on a line 66.

An exclusive NOR gate 68 comprises four p-type transistors 70a–d and four n-type transistors 72a–d coupled together in a known manner as shown to receive address input A0 and its complement A0* and the latched state of fuse 54 represented in signal f0 and its complement signal f0*. Exclusive NOR 68 operates in a known manner to compare the state of fuse 54 as indicated by signals f0 and f0* with the address input A0 represented by A0 and A0* to provide a sub-match signal 0 on a line 74a, which is low when A0=f0 and is high when A0=f0*.

Figure 3:
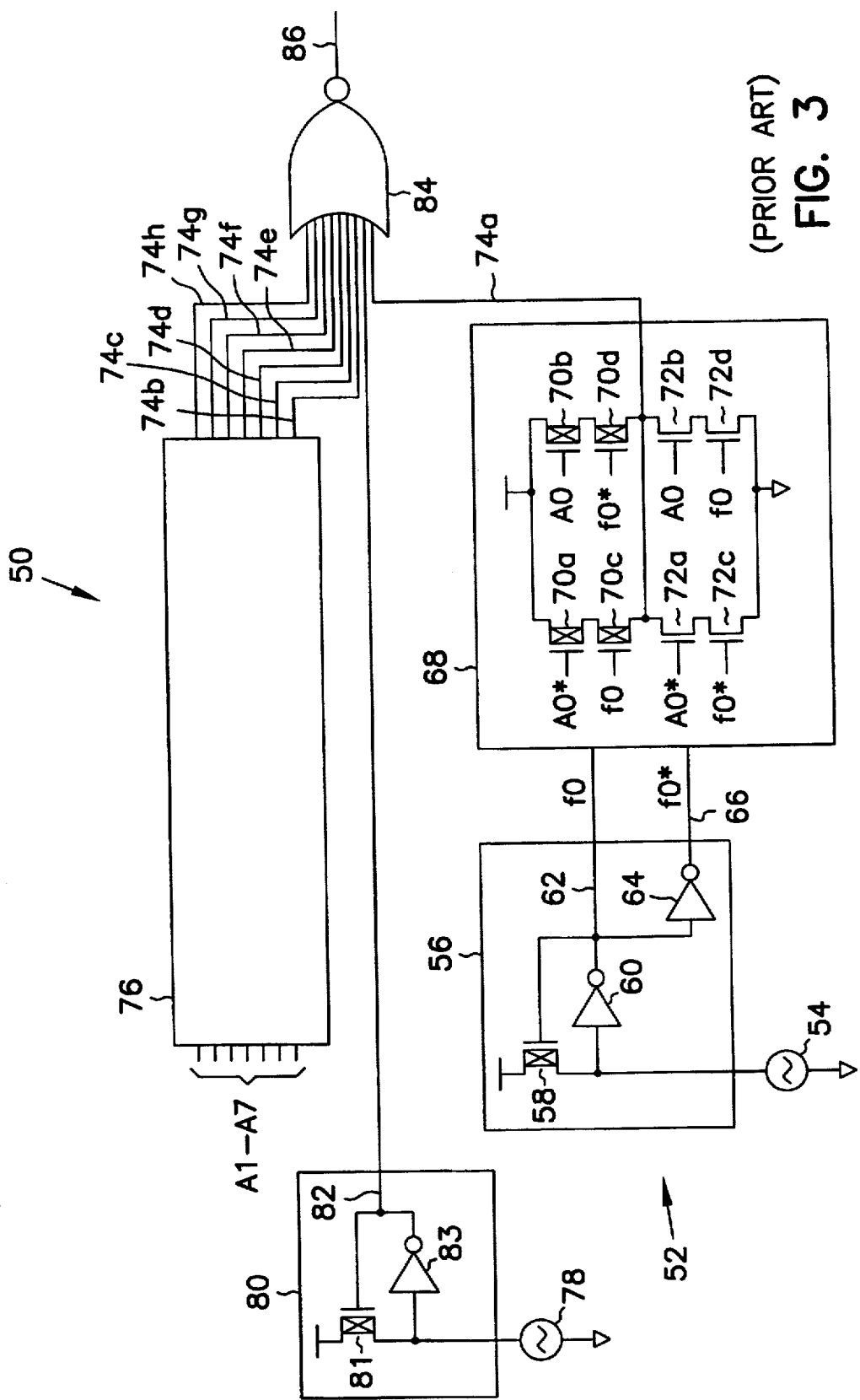
FIG. 3 is a schematic and logical block diagram of a prior art non-precharging match fuse bank circuit.

Corresponding sub-match circuits 52 corresponding to address inputs A1–A7 are representatively illustrated by box 76 in FIG. 3. The sub-match circuit 52 corresponding to address input A1 provides a sub-match signal 1 on a line 74b. Similarly, the sub-match circuits 52 corresponding to address inputs A2–A7 provide sub-match signals 2–7 on corresponding output lines 74c–74h.

A master fuse 78, when not blown, is used to disable, prior to programming of the fuses 54, a valid match of the incoming address bits A0–A7 with the states stored in the corresponding fuse read latches 56. A master fuse read latch 80 reads and latches upon powerup of the DRAM the state of master fuse 78. Master fuse read latch 80 comprises a p-type transistor 81 and an inverter 83 coupled together in a known manner as shown to read and latch the state of master fuse 78 and provide that state on a line 82.

Lines 74a–74h and line 82 are provided to a nine-input NOR gate 84. Nine-input NOR gate 84 provides a match signal on line 86. The match signal on line 86 is activated if every single address input bit A0–A7 matches the corresponding state of the corresponding fuse 54, as indicated by low values on lines 74a–74h, and the state master fuse 78 represents a blown master fuse, as indicated by a low on line 82. The activated match signal on line 86 causes the associated redundant circuit element to be accessed and also disables the associated defective primary circuit element such that the associated defective primary circuit element cannot respond to the address input bits A0–A7.

The prior art match fuse bank circuit 50 requires n+1 fuses to correspond to n address inputs. The silicon area occupied by the compare circuitry represented by exclusive NOR 68 and fuse read latch 56 along with the excessive fanin of the sub-match bit compares to the exclusive NOR 84 is problematic. In addition, if any of the fuses 54 are improperly blown during the programming of match fuse bank circuit 50, the improperly blown fuses 54 can act with transistors 58 as voltage dividers, which causes unsuccessful fuse reads. For example, in some DRAMs typical unblown fuses are approximately 100 ohms and a marginal fuse blow is approximately 50 k ohms or other value which is not of a sufficiently high resistance to be properly read.

Figure 4:
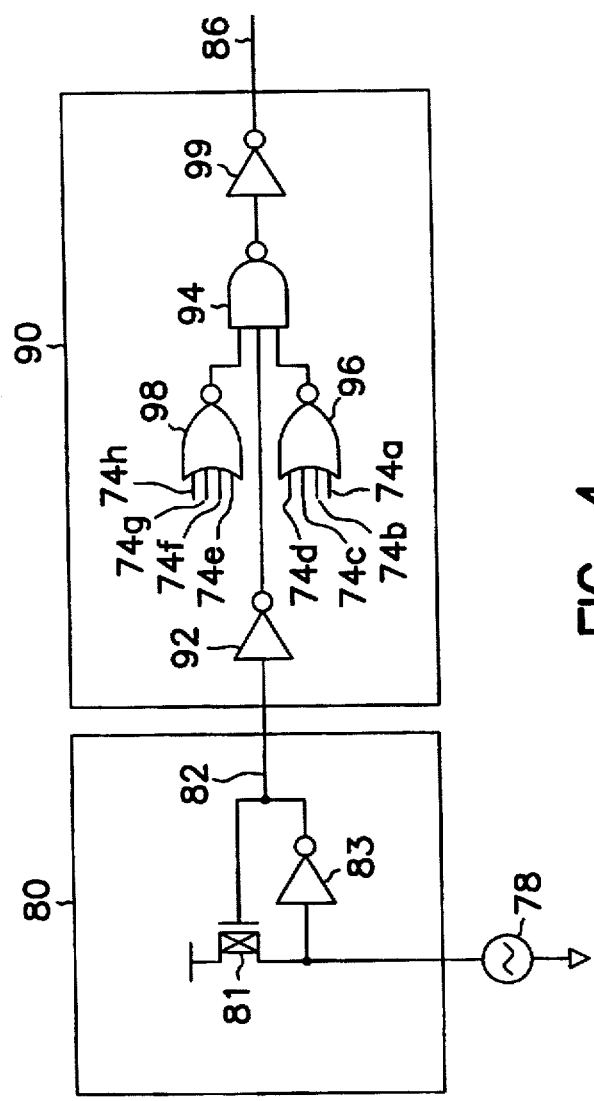
FIG. 4 is schematic and logical block diagram of a logical equivalent circuit to a nine-input NOR gate used in the match fuse bank circuit of FIG. 3.

An alternate prior art logical equivalent circuit to nine input NOR gate 84 is generally illustrated at 90 in FIG. 4. Logical equivalent circuit 90 includes an inverter 92 to invert the state of the master fuse 78 stored in master fuse read latch 80. The output of inverter 92 is provided to a three-input NAND gate 94. The sub-match signals 0–3 on lines 74a–74d are provided to a four-input NOR gate 96. The sub-match signals 4–7 on lines 74e–74h are provided to a four-input NOR gate 98. The outputs of NOR gate 96 and NOR gate 98 are provided to the other two inputs of NAND gate 94. The output of NAND gate 94 is inverted with an inverter 99 to provide the match signal on line 86.

Prior Art Precharging Match Fuse Bank Circuits

Figure 5:
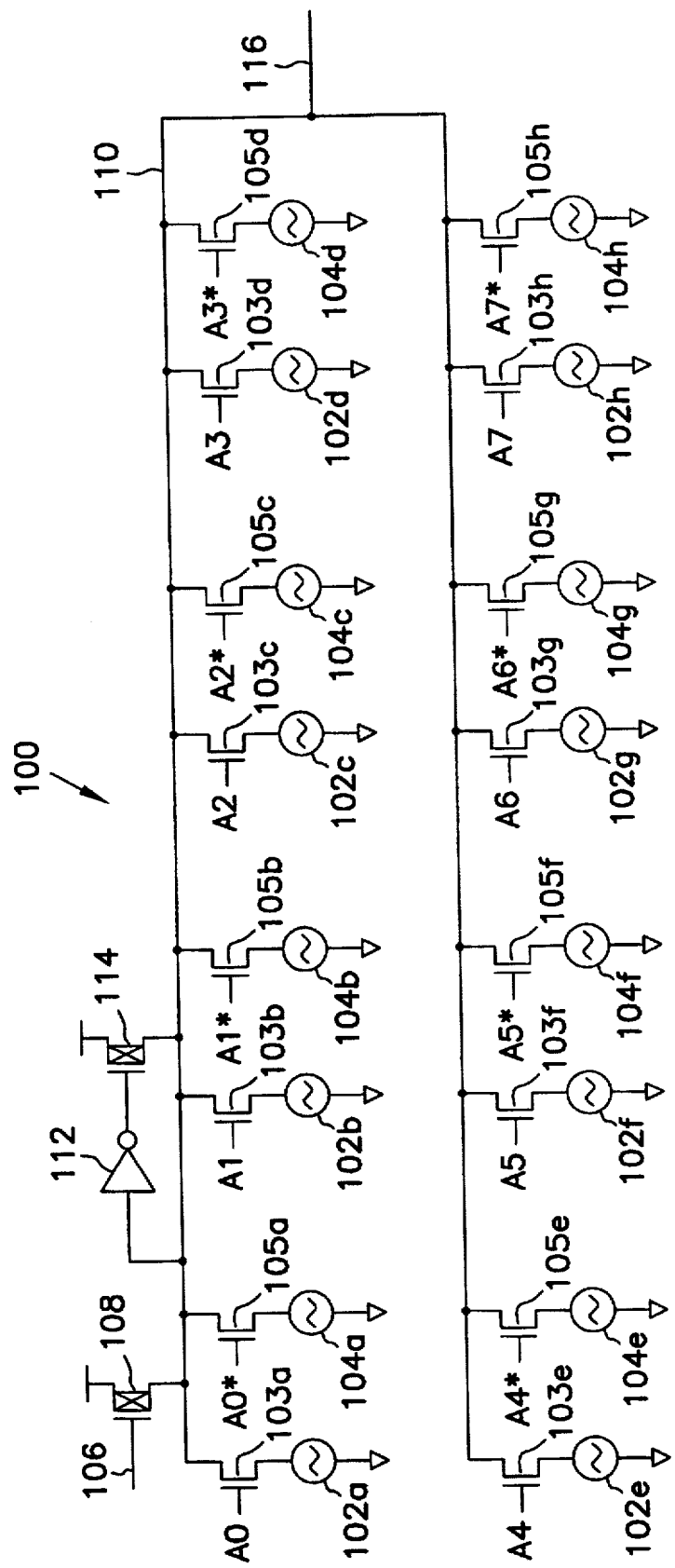
FIG. 5 is a schematic and logical block diagram of a prior art precharging match fuse bank circuit using non-predecoded addresses.

A precharging prior art match fuse bank circuit 100 corresponding to one of the redundant circuit elements of one section of a DRAM is representatively illustrated in FIG. 5. Prior art match fuse bank circuit 100 comprises eight fuses 102a–102h corresponding to address inputs A0–A7. Match fuse bank circuit 100 further comprises eight additional fuses 104a–104h corresponding to complementary address inputs A0*–A7*. Thus, 2n fuses are required to compare n address inputs with match fuse bank circuit 100, as two corresponding fuses are required for each address bit.

A precharge signal is provided on a line 106 to the gate of a p-type transistor 108. With the precharge signal low, p-type transistor 108 is activated to pull a precharge node 110 to a high level. P-type transistor 108 must be shut off prior to addressing match fuse bank circuit 100. Accordingly, an inverter 112 inverts the high level on precharge node 110 to activate a p-type transistor 114, which when activated holds pre charge node 110 high. Thus, when the precharge signal on line 106 returns high, inverter 112 and p-type transistor 114 operate together to latch a high level on precharge node 110.

N-type transistors 103a–103h are correspondingly coupled between fuses 102a–102h and precharge node 110. Address bits A0–A7 are correspondingly coupled to the gates of n-type transistors 103a–103h to control the activation of n-type transistors 103a–103h. N-type transistors 105a–105h are correspondingly coupled between fuses 104a–104h and precharge node 110. Address bits A0*–A7* are correspondingly coupled to the gates of n-type transistors 105a–105h to control the activation of n-type transistors 105a–105h.

Fuses 102a–102h and 104a–104h are selectively blown to program match fuse bank circuit 100 to respond to the address represented by address bits A0–A7, A0*–A7* corresponding to the defective primary circuit element. If an address received on the 16 address lines A0–A7, A0*–A7* matches the address programmed into the fuses, the match fuse bank circuit 100 activates a match signal on a line 116 which is used to access the associated redundant circuit element and disable the defective primary circuit element, such that the defective primary circuit element cannot respond to the address input bits A0–A7.

In operation, both the true and complement address polarities of each address bit (i.e., A0–A7 and A0*–A7*) must be low at precharge time and then transition directly to their corresponding valid state. Thus, an enable circuit (not shown) forces all of the true and complement address bits A0–A7 and A0*–A7* low until the time when the address bits transition directly to their valid states. With the precharge node 110 initially set high, the ones of the incoming address bits A0–A7 and A0*–A7* having high values permit a path for discharging precharge node 110 through the corresponding unblown fuses by switching on the ones of the n-type transistors 103a–103h corresponding to the ones of the true address bits A0–A7 with high values or the ones of n-type transistors 105a–h corresponding to the ones of complementary address bits A0*–A7* with high values.

Thus, prior to programming of match fuse bank circuit 100, the match signal on line 116 is forced low or inactive after the valid address bits cause precharge node 110 to be discharged. After match fuse bank circuit 100 is programmed, if the combination of blown fuses exactly matches the 16 address bits, no path is provided to discharge precharge node 110 which results in the match signal on line 116 being activated to a high state.

Figure 6:
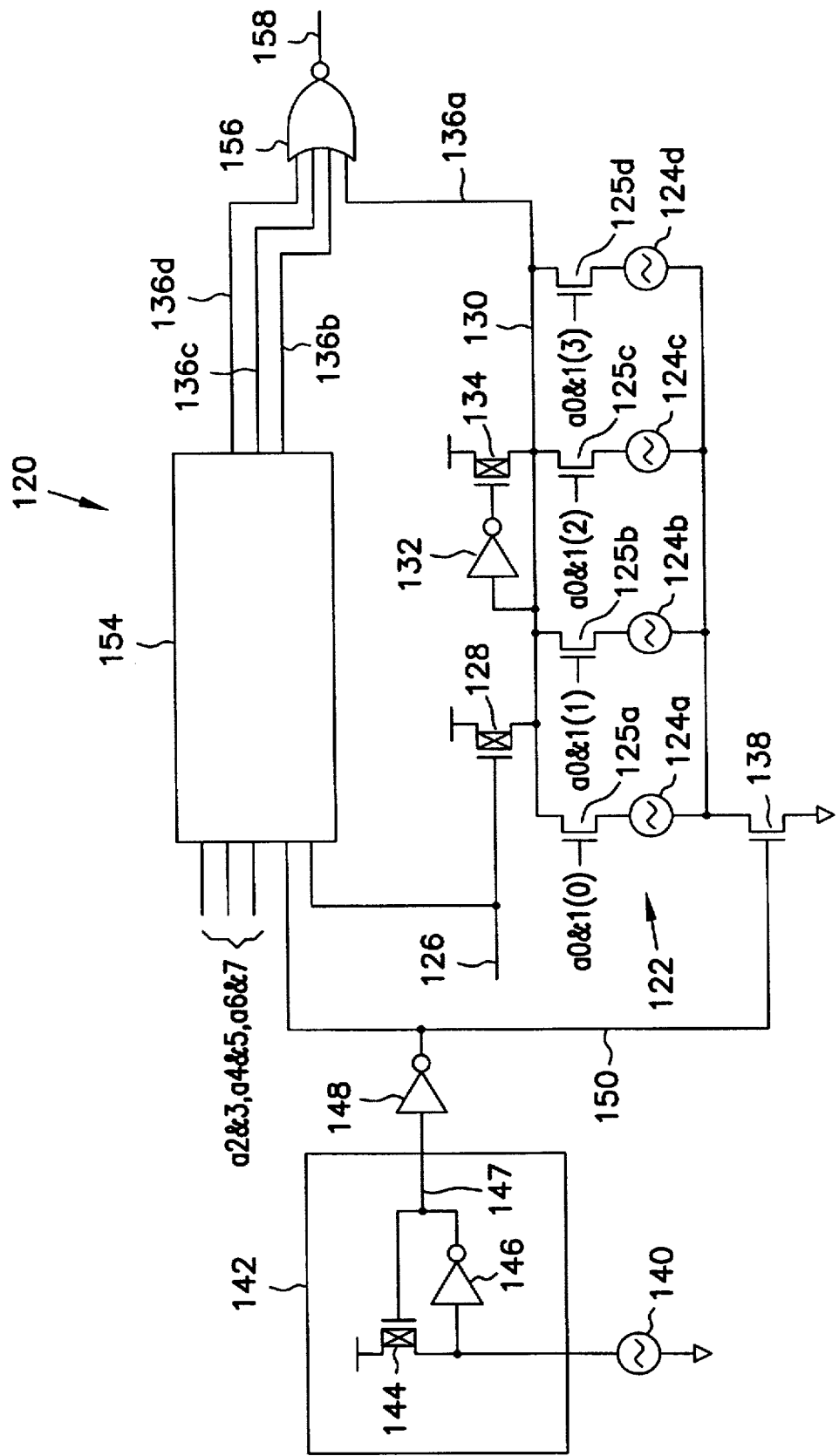
FIG. 6 is a schematic and logical block diagram of a prior art precharging match fuse bank circuit using predecoded addresses.

Another prior art precharging match fuse bank circuit 120 corresponding to one of the redundant circuit elements of one section of a DRAM is representatively illustrated in FIG. 6. Match fuse bank circuit 120 operates similar to prior art match fuse bank circuit 100, but receives predecoded address input bits a0&1(0–3), a2&3(0–3), a4&5(0–3), and a6&7(0–3) in place of the non-predecoded address input bits A0–A7, A0*–A7*. The address bits are predecoded to form the predecoded address bits according to a predecoding scheme represented in TABLE I below or other suitable predecoding scheme. Since the predecoded addresses are typically available from other circuits in a DRAM, and/or are shared with other match fuse bank circuits, predecoding the addresses does not add a significant amount of circuitry to the DRAM.

TABLE I

| A1 | A0 | |
|----|----|----|
| 0 | 0 | a0&1(0) |
| 0 | 1 | a0&1(1) |
| 1 | 0 | a0&1(2) |
| 1 | 1 | a0&1(3) |

Match fuse bank circuit 120 comprises four sub-match circuits 122, each receiving one of the predecoded address sets a0&1(0–3)-a6&7(0–3), such as the sub-match circuit 122 illustrated in detail in FIG. 6 corresponding to predecoded address set a0&1(0–3). Each sub-match circuit 122 comprises four fuses 124a–124h corresponding to the predecoded addresses.

A precharge signal is provided on a line 126 to the gate of a p-type transistor 128. With the precharge signal low, p-type transistor 128 is activated to pull a precharge node 130 to a high level. P-type transistor 128 must be shut off prior to addressing match fuse bank circuit 120. Accordingly, an inverter 132 inverts the high level on precharge node 130 to activate a p-type transistor 134, which when activated holds precharge node 130 high. Thus, wheh the precharge signal on line 126 returns high, inverter 132 and p-type transistor 134 operate together to latch a high level on precharge node 130.

N-type transistors 125a–125d are correspondingly coupled between fuses 124a–124d and precharge node 130.

Predecoded address bits a0&1(0–3) are correspondingly coupled to the gates of n-type transistors 125a–125d to control the activation of n-type transistors 125a–105d. In operation, all of the true and complement address polarities of each address bit (i.e., A0–A7 and A0*–A7*) must be low at precharge time and then transition directly to their corresponding valid state to then be predecoded to form the predecoded address bits a0&1(0–3)-a6&7(0–3). Thus, an enable circuit (not shown) forces all of the true and complement address bits A0–A7 and A0*–A7* low until the time when the address bits transition directly to their valid states.

An n-type transistor 138 is coupled to fuses 124a–124d as shown. A master fuse 140 is read and latched upon powerup of the DRAM by a master fuse read latch 142. Master fuse read latch 142 comprises a p-type transistor 144 and an inverter 146 coupled together in a known manner as shown to read and latch the state of master fuse 140 and to provide that state on aline 147. An inverter 148 inverts the latched state of fuse 140 on line 147 to provide a master signal on a line 150, which is coupled to the gate of n-type transistor 138.

Prior to programming of the fuses in match fuse bank circuit 120, master fuse 140 is not blown, which causes a high level to be stored in master fuse read latch 142 which is inverted by inverter 148 to produce a low level master signal on line 150. With a low master signal on line 150, n-type transistor 138 is not activated. Thus, prior to programming, no path is provided to discharge precharge node 130, which is initially precharged to a high value, because n-type transistor 138 is not active, which results in a high value on a sub-match signal on a line 136a indicating no match.

Programming match fuse bank circuit 120 involves blowing the master fuse 140 and three of four fuses 124a–124d in each sub-match circuit 122. With master fuse 140 blown, the state stored in master fuse read latch 142 is a low value, which is inverted by inverter 148 to produce a high level master signal on line 150. When a valid address is predecoded, three of the four predecoded address inputs a0&1(0–3) are low while one of the four predecoded address inputs corresponding to the predecoded binary value of address bits A0 and A1 is high. The high master signal on line 150 activates n-type transistor 138, which provides a possible path for discharging the precharge node 130. Thus, after programming, if the one of four predecoded address bits a0&a1(0–3) which is high corresponds to the one unblown fuse of fuses 124a–124d, a low value is provided on sub-match signal line 136a.

The other three, four fuse sub-match circuits 122 are representatively illustrated by box 154 in FIG. 6, and provide corresponding sub-match signals on lines 136b–136d. The four sub-match circuits 122 provide sub-match signals on lines 136a–136d to a four-input NOR gate 156. If all of the sub-match signals on lines 136a–136d are low, a match signal provided on a line 158 is activated.

Thus, three of four fuses 124a–124d are selectively blown in each sub-match circuit 122 to program match fuse bank circuit 120 to respond to the address represented by address bits A0–A7 corresponding to the defective primary circuit element. If an address received on the predecoded address bits a0&1(0–3)-a6&7(0–3) matches the address programmed into the fuses, match fuse bank circuit 120 activates a match signal on line 158 as described above which is used to access the associated redundant circuit element and disable the defective primary circuit element, such that the defective primary circuit element cannot respond to the address input bits A0–A7.

Prior art match fuse bank circuit 120 requires 2n+1 fuses to compare n address inputs, as two corresponding fuses are required for each address bit in addition to the master fuse.

Prior art precharged match fuse bank circuits 100 and 120 have some distinct advantages and disadvantages as compared to prior art non-precharged match fuse bank circuit 50. No sub-match signals need be compared in match fuse bank circuit 100 illustrated in FIG. 5, because match fuse bank circuit 100 consolidates all match information upon one node (precharge node 110). Thus, prior art match fuse bank circuit 100 completely solves the fanin problem of prior art match fuse bank circuit 50. The sub-match signals which need to be compared in prior art match fuse bank circuit 120 of FIG. 6 are approximately half of the sub-match signals of match fuse bank circuit 50, which reduces the fanin to the final NOR compare circuit by approximately 50%. In most cases, the added number of fuses (the 2n fuses for match fuse bank circuit 100 or the 2n+1 fuses for match fuse bank circuit 120 compared to the n+1 fuses of match fuse bank circuit 50) consumes less die area in the DRAM then the additional real estate occupied by the complex circuits of match fuse bank circuit 50. Nevertheless, the above described problem resulting from improperly blown fuses is not solved with prior art match fuse bank circuits 100 and 120 since a marginal fuse blow will cause charge to be leaked off of precharge node 110, which may lead to erroneous results.

More significantly, match fuse bank circuits 100 and 120 require a precharge time followed by a valid address with no invalid address being presented. The required precharge time does not significantly affect the performance of match fuse bank circuits 100 and 120 when employed for row redundancy on DRAMs. However, because of the required precharge lime, match fuse bank circuits 100 and 120 are not useful for column repair on fast page DRAMs due to the specification in the DRAMs which permits presentation of invalid column addresses with no precharge time to valid column address.

Non-Precharged Match Bank Circuits According to the Present Invention

Figure 7:
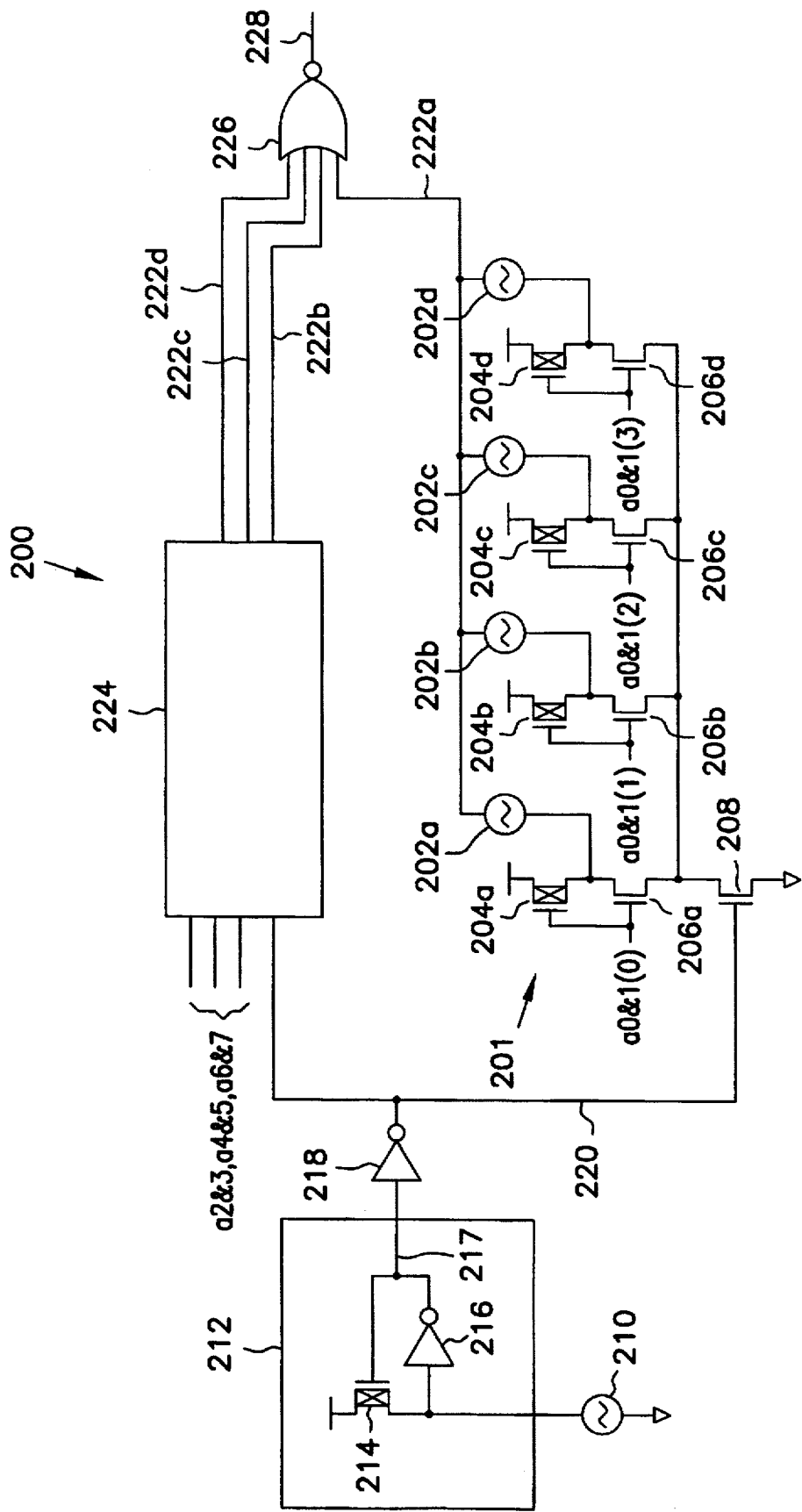
FIG. 7 is a schematic and logical block diagram of a non-precharging match fuse bank circuit according to the present invention using two bit address predecoding.

A preferred embodiment of a non-precharged match fuse bank circuit corresponding to one of the redundant circuit elements of one section of a DRAM according to the present invention is illustrated generally at 200 in FIG. 7. Match fuse bank circuit 200 receives predecoded address input bits a0&1(0–3), a2&3(0–3), a4&5(0–3), and a6&7(0–3). The address bits A0–A7 are predecoded to form the predecoded address bits a0&1(0–3), a2&3(0–3), a4&5(0–3), and a6&7 (0–3) according to the predecoding scheme represented in TABLE I above or other suitable predecoding scheme. Since the predecoded addresses are typically available from other circuits in a DRAM, and/or are shared with other match fuse bank circuits, predecoding the addresses does not add a significant amount of circuitry to the DRAM. Match fuse bank 200 is representatively illustrated for responding to only eight address inputs A0–A7 for clarity, but could be adapted to be substituted for match fuse bank circuit 40 of FIG. 2 to be employed in a 64 megabit DRAM or adapted to be employed in memories or integrated circuits comprising any of a number of primary circuit elements configured in any suitable arrangement.

Match fuse bank 200 comprises four separate sub-match circuits 201. For example, sub-match circuit 201 corresponding to the predecoded address inputs a0&1(0–3) is illustrated in detailed schematic diagram form in FIG. 7. Sub-match circuit 201 comprises four fuses 202a–202d.

Fuses 202a–202d are correspondingly coupled to p-type transistors 204a–204d and n-type transistors 206a–206d as shown. Address inputs a0&1(0–3) are correspondingly provided to the gates of p-type transistors 204a–204d and n-type transistors 206a–206d to control the activation of transistors 204a–204d and 206a–206d.

An n-type transistor 208 is coupled to n-type transistors 206a–206d as shown. A master fuse 210 is read and latched upon powerup of the DRAM by a master fuse read latch 212. Master fuse read latch 212 comprises a p-type transistor 214 and an inverter 216 coupled together in a known manner as shown to read and latch the state of master fuse 210 and to provide that state on a line 217. An inverter 218 inverts the latched state of fuse 210 on line 217 to provide a master signal on a line 220, which is coupled to the gate of n-type transistor 208.

Prior to programming of the fuses in match fuse bank circuit 200, master fuse 210 is not blown, which causes a high level to be stored in master fuse read latch 212 which is inverted by inverter 218 to produce a low level master signal on line 220. With a low master signal on line 220, n-type transistor 208 is not activated. Prior to programming, fuses 202a–202d are also not blown. Thus, when a valid address is predecoded, three of the four predecoded address inputs a0&1(0–3) are low while one of the four predecoded address inputs corresponding to the predecoded binary value of address bits A0 and A1 is high. A sub-match signal on a line 222a is formed high by the activation of three of the p-type transistors 204a–204d corresponding to the three predecoded address inputs which are low.

Programming match fuse bank circuit 200 involves blowing master fuse 210 and three of four fuses 202a–202d in each sub-match circuit 201. Since the address inputs A0–A7 are predecoded in groups of two (i.e., A0–A1, A2–A3, A4–A5, and A6–A7), programming match fuse bank circuit 200 produces a two input NAND function at each sub-match circuit 201 having the master signal on line 220 and the one of the predecoded address inputs corresponding to the one unblown fuse of fuses 202a–202d as inputs and the sub-match signal on line 222a as an output. With master fuse 210 blown, the state stored in master fuse read latch 212 is a low value, which is inverted by inverter 218 to produce a high level master signal on line 220. The high master signal on line 220 activates n-type transistor 208, which provides a low value to each of the n-type transistors 206a–206d. With three of the four fuses blown, only one path is provided to the sub-match signal line 222a. If the one of four predecoded address bits a0&a1(0–3) which is high corresponds to the one unblown fuse of fuses 202a–202d, a low value is provided on sub-match signal line 222a.

The other three, four fuse sub-match circuits 201 are representatively illustrated by box 224 in FIG. 7, and provide corresponding sub-match signals on lines 222b–222d. The four sub-match circuits 201 provide sub-match signals on lines 222a–222d to a four-input NOR gate 226. If all of the sub-match signals on lines 222a–222d are low, a match signal provided on a line 228 is activated.

Thus, three of four fuses 202a–202d are selectively blown in each sub-match circuit 201 to program match fuse bank circuit 200 to respond to the address represented by address bits A0–A7 corresponding to the defective primary row or column. If an address received on the predecoded address bits a0&1(0–3)-a6&7(0–3) matches the address programmed into the fuses, match fuse bank circuit 200 activates the match signal on line 228 as described above, which is used to access the associated redundant row or column and disable the defective primary row or column, such that the defective row or column cannot respond to the address input bits A0–A7.

Match fuse bank circuit 200 requires at least 2n+1 fuses for a compare of all fuses to n address inputs. By predecoding the address inputs, the fanin to the final NOR compare circuitry is approximately reduced in half compared to prior art match fuse bank circuit 50 of FIG. 3. It is possible to further reduce the fanin by adding additional fuses, if this tradeoff is deemed to be efficient use of area, such as discussed below in reference to an alternative embodiment of the present invention illustrated in FIG. 9. Furthermore, the compare circuit of match fuse bank circuit 200 for comparing the states of the 2n+1 fuses to the predecoded address inputs occupies significantly less silicon area in the integrated circuit than the prior art exclusive NOR/NOR function of match fuse bank circuit 50 of FIG. 3. Moreover, match fuse bank circuit 200 does not require the precharging of a precharge node such as required by prior art match fuse bank circuits 100 and 120 illustrated in FIGS. 5 and 6. In this way, real time compares can be performed with match fuse bank circuit 200, such as required for fast page column DRAM addressing.

Figure 8:
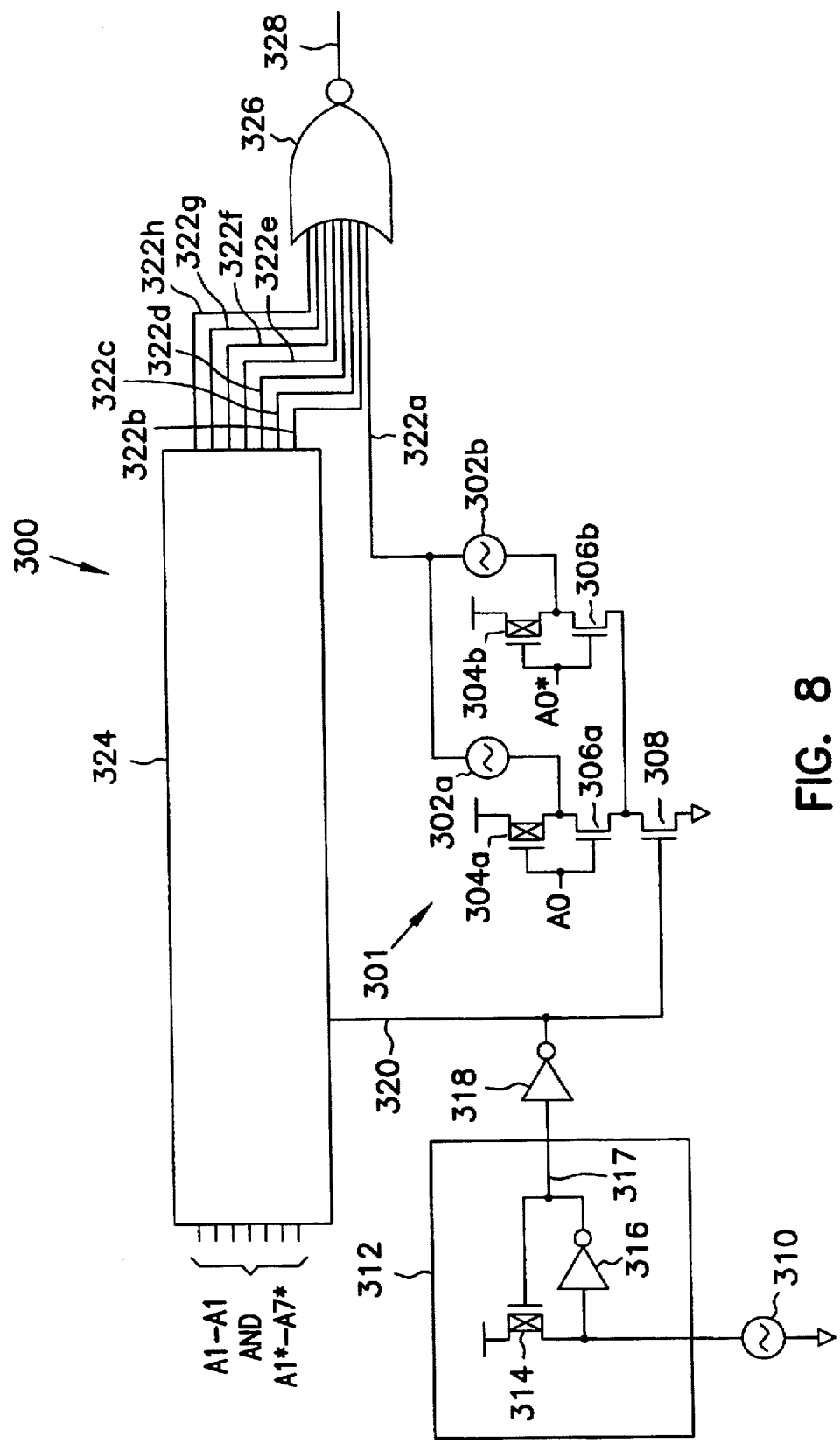
FIG. 8 is a schematic and logical block diagram of a non-precharging match fuse bank circuit according to the present invention using non-predecoded addresses.

Another embodiment of a non-precharged match fuse bank circuit corresponding to one of the redundant circuit elements of one section of a DRAM according to the present invention is illustrated generally at 300 in FIG. 8. Match fuse bank circuit 300 receives non-predecoded address input bits A0–A7 directly instead of the predecoded address input bits such as received by match fuse bank circuit 200 illustrated in FIG. 7. Match fuse bank 300 is representatively illustrated for responding to only eight address inputs A0–A7 for clarity, but could be adapted to be substituted for match fuse bank circuit 40 of FIG. 2 to be employed in a 64 megabit DRAM or adapted to be employed in memories or integrated circuits comprising any of a number of primary circuit elements configured in any suitable arrangement.

Match fuse bank 300 comprises eight separate sub-match circuits 301. For example, sub-match circuit 301 corresponding to the address inputs A0 and A0* is illustrated in detailed schematic diagram form in FIG. 8. Sub-match circuit 401 comprises two fuses 302a and 302b. Fuses 302a and 302b are respectively coupled to p-type transistors 304a and 304b and n-type transistors 306a and 306d as shown. Address inputs A0 and A0* are respectively provided to the gates of p-type transistors 304a and 304b and n-type transistors 306a and 306b to control the activation of transistors 304a, 304b, 306a, and 306b.

An n-type transistor 308 is coupled to n-type transistors 306a and 306b as shown. A master fuse 310 is read and latched upon powerup of the DRAM by a master fuse read latch 312. Master fuse read latch 312 comprises a p-type transistor 314 and an inverter 316 coupled together in a known manner as shown to read and latch the state of master fuse 310 and to provide that state on a line 317. An inverter 318 inverts the latched state of fuse 310 on line 317 to provide a master signal on a line 320, which is coupled to the gate of n-type transistor 308.

Prior to programming of the fuses in match fuse bank circuit 300, master fuse 310 is not blown, which causes a high level to be stored in master fuse read latch 312 which is inverted by inverter 318 to produce a low level master signal on line 320. With a low master signal on line 320, n-type transistor 308 is not activated. Prior to programming, fuses 302a and 302b are also not blown. When a valid address is received, one of the address inputs A0 or A0* must be low while the other one is high. A sub-match signal on a line 322a is forced high by the activation of one of the p-type transistors 304a or 304b corresponding to the address input which is low.

Programming match fuse bank circuit 300 involves blowing master fuse 310 and one of the fuses 302a or 302b in each sub-match circuit 301. Programming match fuse bank circuit 300 produces a two input NAND function at each sub-match circuit 301 having the master signal on line 320 and the one of the predecoded address inputs corresponding to the one unblown fuse of fuses 302a and 302b as inputs and the sub-match signal on line 322a as an output. With master fuse 310 blown, the state stored in master fuse read latch 312 is a low value, which is inverted by inverter 318 to produce a high level master signal on line 320. The high master signal on line 320 activates n-type transistor 308, which provides a low value to the n-type transistors 306a and 306b. With one of the two fuses blown, only one path is provided to the sub-match signal line 322a. If the high address bit of A0 and A0* corresponds to the one unblown fuse of fuses 302a and 302b, a low value is provided on sub-match signal line 322a.

The other seven, two fuse sub-match circuits 301 are representatively illustrated by box 324 in FIG. 8, and provide corresponding sub-match signals on lines 322b-322h. The eight sub-match circuits 301 provide sub-match signals on lines 322a-322h to an eight-input NOR gate 326. If all of the sub-match signals on lines 322a-322h are low, a match signal provided on a line 328 is activated.

Thus, one of fuses 302a or 302b is selectively blown in each sub-match circuit 301 to program match fuse bank circuit 300 to respond to the address represented by address bits A0–A7 corresponding to the defective primary row or column. If an address received on the address bits A0–A7 matches the address programmed into the fuses, match fuse bank circuit 300 activates the match signal on line 328 as described above, which is used to access the associated redundant row or column and disable the defective primary row or column, such that the defective row or column cannot respond to the address input bits A0–A7.

Match fuse bank circuit 300 requires 2n+1 fuses for a compare of all fuses to n address inputs. Because match fuse bank circuit 300 does not predecode the address inputs, the fanin to the final NOR compare circuitry is approximately the same as prior art match fuse bank circuit 50 of FIG. 3. It is possible to reduce the fanin by adding additional fuses and predecoding the addresses, such as discussed above and in reference to the preferred embodiment of the invention illustrated in FIG. 7 or as discussed below in reference to the alternative embodiment of the present invention illustrated in FIG. 9, if this tradeoff is deemed to be efficient use of area. The compare circuit of match fuse bank circuit 300 for comparing the states of the 2n+1 fuses to the predecoded address inputs occupies significantly less silicon area in the integrated circuit than the prior art exclusive NOR/NOR function of match fuse bank circuit 50 of FIG. 3. Moreover, match fuse bank circuit 300 does not require the precharging of a precharge node such as required by prior art match fuse bank circuits 100 and 120 illustrated in FIGS. 5 and 6. In this way, real time compares can be performed with match fuse bank circuit 300, such as required for fast page column DRAM addressing.

Figure 9:
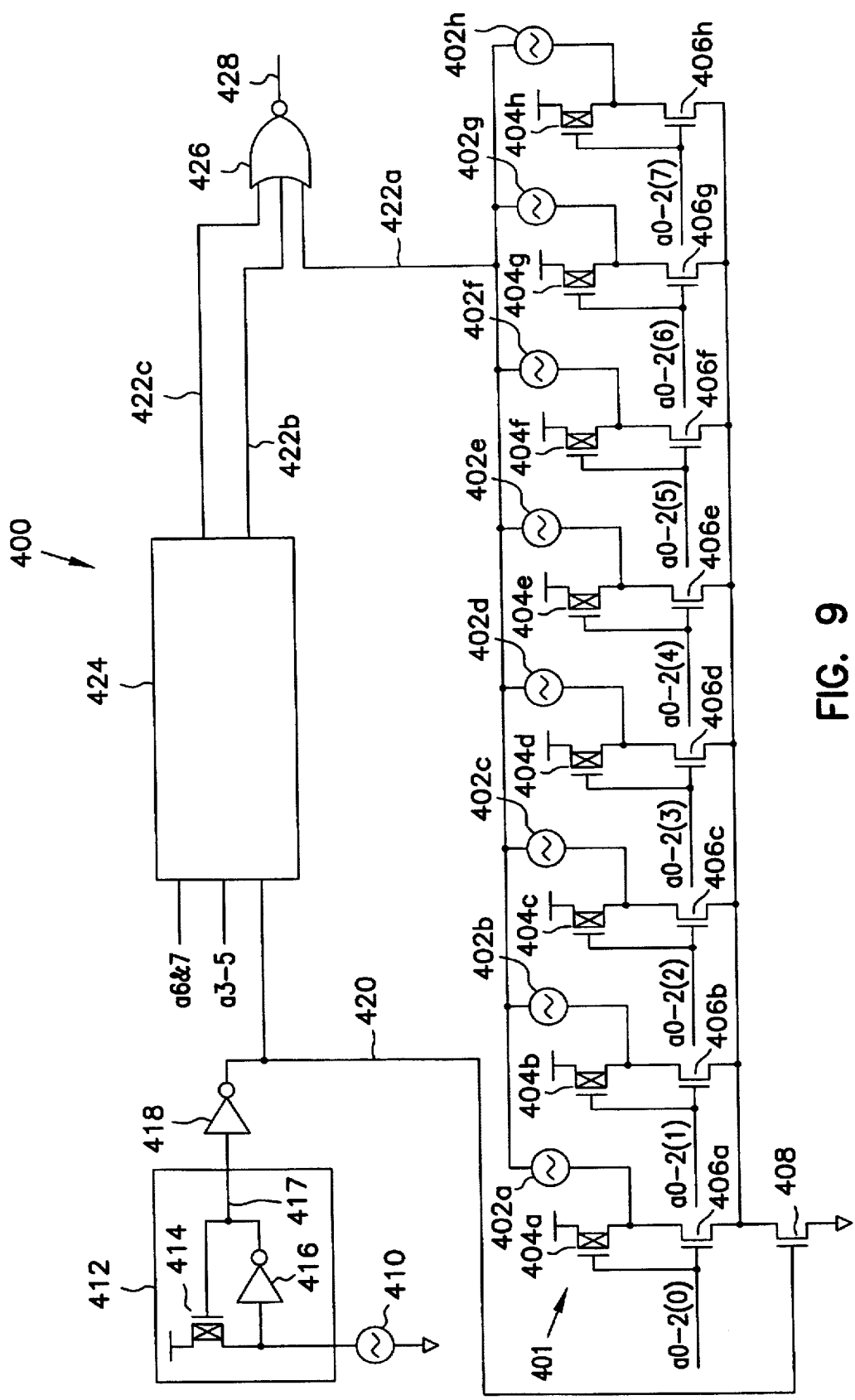
FIG. 9 is a schematic and logical block diagram of a non-precharging match fuse bank circuit according to the present invention using three bit address predecoding.

Another embodiment of a non-precharged match fuse bank circuit corresponding to one of the redundant circuit elements of one section of a DRAM according to the present invention is illustrated generally at 400 in FIG. 9. Match fuse bank circuit 400 receives predecoded address input bits a0–2(0–7), a3–5(0–3), and a6&7(0–3). The address bits A0–A7 are predecoded to form the predecoded address bits a0–2(0–7), a3–5(0–3), and a6&7(0–3) according to the predecoding scheme represented in TABLE II below for three address inputs and TABLE I above for two address inputs or other suitable predecoding scheme. Since the predecoded addresses are typically available from other circuits in a DRAM, and/or are shared with other match fuse bank circuits, predecoding the addresses does not add a significant mount of circuitry to the DRAM. Match fuse bank 400 is representatively illustrated for responding to only eight address inputs A0–A7 for clarity, but could be adapted to be substituted for match fuse bank circuit 40 of FIG. 2 to be employed in a 64 megabit DRAM or adapted to be employed in memories or integrated circuits comprising any of a number of primary circuit elements configured in any suitable arrangement.

TABLE II

| A2 | A1 | A0 | |
|---|---|---|---|
| 0 | 0 | 0 | a0–2(0) |
| 0 | 0 | 1 | a0–2(1) |
| 0 | 1 | 0 | a0–2(2) |
| 0 | 1 | 1 | a0–2(3) |
| 1 | 0 | 0 | a0–2(4) |
| 1 | 0 | 1 | a0–2(5) |
| 1 | 1 | 0 | a0–2(6) |
| 1 | 1 | 1 | a0–2(7) |

Match fuse bank 400 comprises three separate sub-match circuits 401, one containing four fuses and two containing eight fuses. For example, sub-match circuit 401 corresponding to the predecoded address inputs a0–2(0–7) is illustrated in detailed schematic diagram form in FIG. 7. Sub-match circuit 201 comprises eight fuses 402a–402h. Fuses 402a–202h are correspondingly coupled to p-type transistors 404a–404h and n-type transistors 406a–406h as shown. Address inputs a0–2(0–7) are correspondingly provided to the gates of p-type transistors 404a–404h and n-type transistors 406a–406h to control the activation of transistors 404a–404h and 406a–406h.

An n-type transistor 408 is coupled to n-type transistors 406a–406h as shown. A master fuse 410 is read and latched upon powerup of the DRAM by a master fuse read latch 412. Master fuse read latch 412 comprises a p-type transistor and an inverter 416 coupled together in a known manner as shown to read and latch the state of master fuse 410 and to provide that state on a line 417. An inverter inverts the latched state of fuse 410 on line 417 to provide a master signal on a line 420, which is coupled to the gate of n-type transistor 408.

Prior to programming of the fuses in match fuse bank circuit 400, master fuse 410 is not blown, which causes a high level to be stored in master fuse read latch 412 which is inverted by inverter 418 to produce a low level master signal on line 420. With a low master signal on line 420, n-type transistor 408 is not activated. Prior to programming, fuses 402a–402h are also not blown. Thus, when a valid address is predecoded, seven of the eight predecoded address inputs a0–2(0–7) are low while one of the eight predecoded address inputs corresponding to the predecoded binary value of address bits A0–A2 is high. A sub-match signal on a line 422a is forced high by the activation of seven of the p-type transistors 404a–404h corresponding to the seven predecoded address inputs which are low.

Programming match fuse bank circuit 400 involves blowing master fuse 410 and seven of eight fuses 402a–402h in each sub-match circuit 401. Since the address inputs A0–A7 are predecoded in groups of three and two (i.e., A0–A2, A3–A5, and A6–A7), programming match fuse bank circuit 400 produces a two input NAND function at each sub-match circuit 401 having the master signal on line 420 and the one of the predecoded address inputs corresponding to the one unblown fuse of fuses 402a–402h as inputs and the sub-match signal on line 422a as an output. With master fuse 410 blown, the state stored in master fuse read latch 412 is a low value, which is inverted by inverter 418 to produce a high level master signal on line 420. The high master signal on line 420 activates n-type transistor 408, which provides a low value to each of the n-type transistors 406a–406h. With seven of the eight fuses blown, only one path is provided to the sub-match signal line 422a. If the one of eight predecoded address bits a0–2(0–7) which is high corresponds to the one unblown fuse of fuses 402a–402h, a low value is provided on sub-match signal line 422a.

The other two, eight and four fuse sub-match circuits 401 are representatively illustrated by box 424 in FIG. 9, and provide corresponding sub-match signals on lines 422b and 422c. The three sub-match circuits 401 provide sub-match signals on lines 422a–422c to a three-input NOR gate 426. If all of the sub-match signals on lines 422a–422c are low, a match signal provided on a line 428 is activated.

Thus, seven of eight fuses 402a–402h are selectively blown in two of the sub-match circuits 401 and three of four fuses 402a–402d are selectively blown in one of the sub-match circuits 401 to program match fuse bank circuit 200 to respond to the address represented by address bits A0–A7 corresponding to the defective primary row or column. If an address received on the predecoded address bits a0–2(0–7), a3–5(0–7), and a6&7(0–3) matches the address programmed into the fuses, match fuse bank circuit 400 activates the match signal on line 428 as described above, which is used to access the associated redundant row or column and disable the defective primary row or column, such that the defective row or column cannot respond to the address input bits A0–A7.

Match fuse bank circuit 400 requires at least (8n/3)+1 fuses for a compare of all fuses to n address inputs. By predecoding the address inputs, the fanin to the final NOR compare circuitry is approximately reduced by two thirds compared to prior art match fuse bank circuit 50 of FIG. 3. It is possible to even further reduce the fanin by adding additional fuses, if this tradeoff is deemed to be efficient use of area. Furthermore, the compare circuit of match fuse bank circuit 400 for comparing the states of the (8n/3)+1 fuses to the predecoded address inputs occupies significantly less silicon area in the integrated circuit thin the prior art exclusive NOR/NOR function of match fuse bank circuit 50 of FIG. 3. Moreover, match fuse bank circuit 400 does not require the precharging of a precharge node such as required by prior art match fuse bank circuits 100 and 120 illustrated in FIGS. 5 and 6. In this way, real time compares can be performed with match fuse bank circuit 400, such as required for fast page column DRAM addressing.

Gate Count Estimates

A comparison of the silicon area occupied by the non-precharged match fuse bank circuits of the present invention and the prior art non-precharged and precharged match fuse bank circuits is represented in TABLES III–IX below which respectively provide approximate gate counts for the prior art match fuse bank circuits illustrated in FIGS. 3–6 and each of the embodiments of the match fuse bank circuits 200, 300, and 400 according to the present invention illustrated in FIGS. 7–9.

Figure 10A:
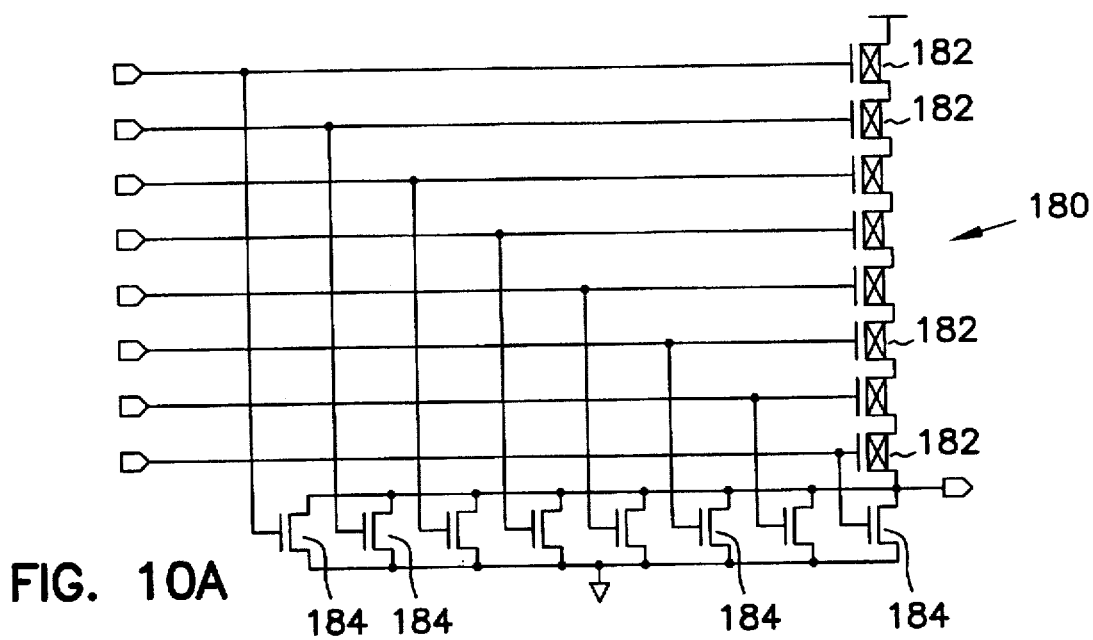
FIGS. 10A–10D are detailed schematic gate level diagrams of some of the logical components employed in the match fuse bank circuits illustrated in FIGS. 3–9.
Figure 10B:
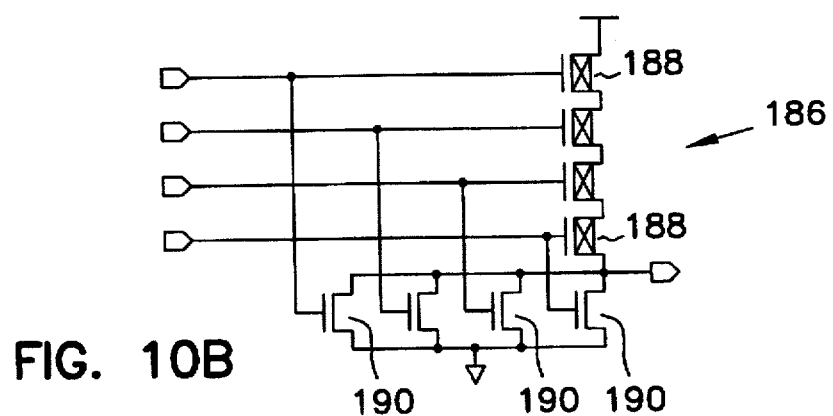
Figure 10C:
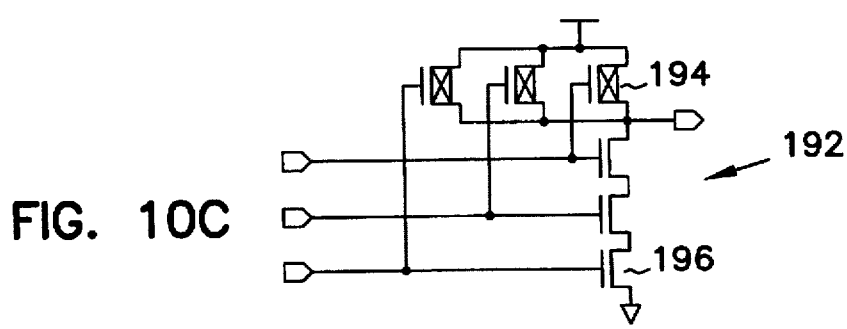
Figure 10D:
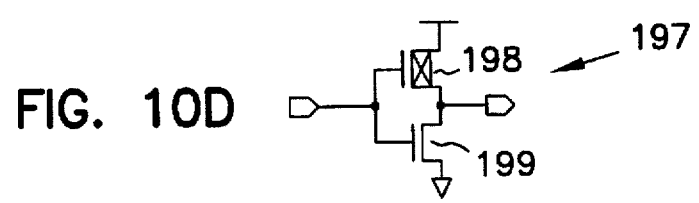

The gate counts in TABLES III–IX below are based in part on known logical gate configurations illustrated in FIGS. 10A–10D. For example, a known configuration of an eight-input NOR gate requiring 16 transistors is generally illustrated in FIG. 10A at 180. Eight-input NOR gate 180 comprises eight p-type transistors 182 and eight n-type transistors 184 coupled in a known manner as shown to provide the NOR function output based on the eight inputs. Similarly, a four-input NOR gate, which is configured in a conventional manner, is generally illustrated at 186 in FIG. 10B. Four-input NOR gate 186 comprises four p-type transistors 188 and four n-type transistors 190. FIG. 10C illustrates a conventional configuration of a three-input NAND gate 192 comprising three p-type transistors 194 and three n-type transistors 196. FIG. 10D illustrates a conventional configuration of an inverter 197 comprising a p-type transistor 198 and a n-type transistor 199.

TABLE III

Prior Art Non-Precharged Match Fuse Bank Circuit 50
(shown in FIG. 3)

| Using 9 input NOR: (9th input is for master) | |
|---|---|
| read latch & EXNOR | 8 × 13 = 104 |
| master fuse latch (w/1 invertor) | 1 × 3 = 3 |
| 9 input NOR | 1 × 18 = 18 |
| TOTAL | 125 transistors for 8 bit compare or 15.6 transistors per bit. |

TABLE IV

Prior Art Non-Precharged Match Fuse Bank Circuit 50
(shown in FIGS. 3 & 4)

| Using cascaded NOR then NAND-INVERT: | |
|---|---|
| read latch & EXNOR | 8 × 13 = 104 |
| master fuse latch (w/2 invertor) | 1 × 5 = 5 |
| 4 input NOR | 2 × 8 = 16 |
| 3 input NAND | 1 × 6 = 6 |
| INVERTOR | 1 × 2 = 2 |
| TOTAL | = 133 transistors for 8 bit compare or 16.6 transistors per bit. |

TABLE V

Prior Art Precharged Match Fuse Bank Circuit 100
(shown in FIG. 5)

| TOTAL | = 20 transistors for 8 bit compare or 2.5 transistors per bit. |
|---|---|

TABLE VI

Prior Art Precharged Match Fuse Bank Circuit 120
(shown in FIG. 6)

| 4 fuse sub-match circuit | 4 × 9 = 36 |
|---|---|
| master fuse latch (w/2 invertor) | 1 × 5 = 5 |
| 4 input NOR | 1 × 8 = 8 |
| TOTAL | = 49 transistors for 8 bit compare or 6.1 transistors per bit. |

TABLE VII

Non-Precharged Match Fuse Bank Circuit 200
(shown in FIG. 7)

| | | |
|---|---|---|
| 4 fuse sub-match circuit | 4 × 9 = 36 | |
| master fuse latch (w/2 invertor) | 1 × 5 = 5 | |
| 4 input NOR | 1 × 8 = 8 | |
| TOTAL | = 49 | transistors for 8 bit compare or 6.1 transistors per bit. |

TABLE VIII

Non-Precharged Match Fuse Bank Circuit 300
(shown in FIG. 8)

| | | |
|---|---|---|
| 2 fuse sub-match circuit | 8 × 5 = 40 | |
| master fuse latch (w/2 invertor) | 1 × 5 = 5 | |
| 8 input NOR | 1 × 16 = 16 | |
| TOTAL | = 61 | transistors for 8 bit compare or 7.6 transistors per bit. |

TABLE IX

Non-Precharged Match Fuse Bank Circuit 400
(shown in FIG. 9)

| | | |
|---|---|---|
| 8 fuse sub-match circuit | 2 × 17 = 34 | |
| 4 fuse sub-match circuit | 1 × 9 = 9 | |
| master fuse latch (w/2 invertor) | 1 × 5 = 5 | |
| 3 input NOR | 1 × 6 = 6 | |
| TOTAL | = 54 | transistors for 8 bit compare or 6.7 transistors per bit. |

Marginal Fuse Blows

The three prior art embodiments illustrated in FIGS. 3–6 all have failed in some situations where marginal fuse blows occur, such as by marginally blowing a fuse to approximately 50 k ohms or other value which is not of a sufficiently high resistance to be properly read. The present invention also uses a latch to read the master fuse which would also fail if it were identical to those used in the prior art master and regular fuse read latch circuits. However, since there are significantly less fuse read latches with the present invention due having only one master fuse per match fuse bank circuit of the present invention, double fuses can be utilized to achieve 100 k ohms between two marginal fuse blows or a normal open condition if one of the two fuses is properly blown. Aside form the master fuse, the compare circuits of the present invention are much more robust in correctly interpreting marginal fuse blows because the path through the unblown fuse always dominates over the more resistive path of the marginally blown fuse or fuses.

Figure 11:
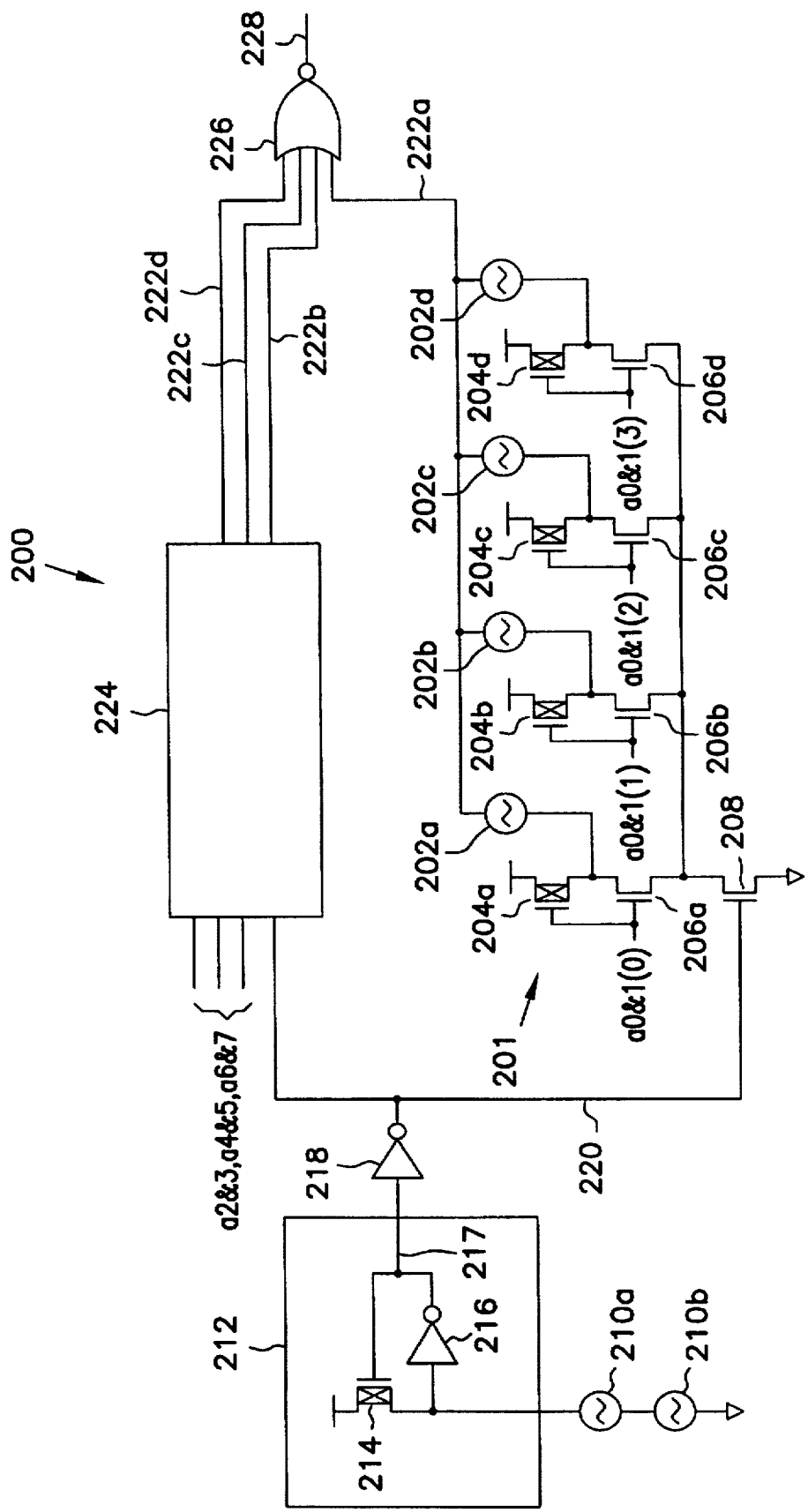
FIG. 11 is a schematic and logical block diagram of a non-precharging match fuse bank circuit according to the present invention using two bit address predecoding and comprising two master fuses coupled in series.

FIG. 11 illustrates an extension of the preferred embodiment of the match fuse bank circuit 200 of FIG. 7, wherein two fuses 210a and 210b are substituted for fuse 210 so that if marginal fuse blows occur, the two fuses can be held in series to yield twice the resistance. Alternatively, additional fuse read current is supplied to the master fuse read latch of the present invention to aid in successful reading and latching of the master fuse. The additional current cannot be supplied to the substantial number of fuse read latches as required in prior art match fuse bank circuit 50 of FIG. 3 due to power consumption limitations.

Figure 12:
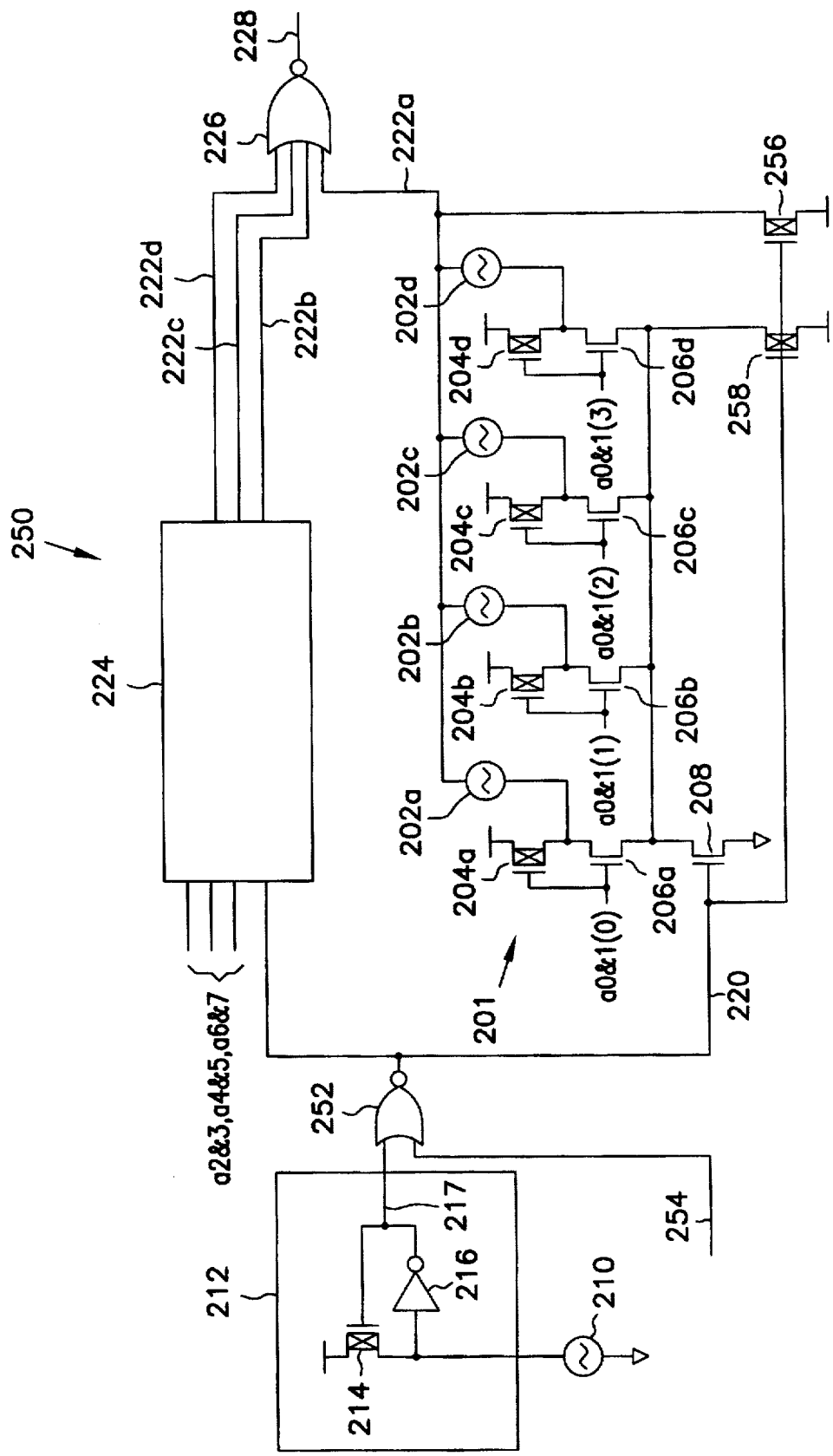
FIG. 12 is a schematic and logical block diagram of a non-precharging match fuse bank circuit according to the present invention using two bit address predecoding and having additional circuits for disabling redundancy.

Non-Precharged Match Bank Circuit According to the Present Invention with Redundancy Disable Mode Another preferred embodiment of a non-precharged match fuse bank circuit corresponding to one of the redundant circuit elements of one section of a DRAM according to the present invention is illustrated generally at 250 in FIG. 12. Match fuse bank circuit 250 is similar to match bank 200 illustrated in FIG. 7, except that match fuse bank 250 includes additional circuitry for permitting a user of the DRAM according to the present invention to disable redundancy once master fuse 210 and three of four of fuses 202a–202d have been programmed. Thus, like element numbers are used in FIG. 12 for like elements illustrated in FIG. 7, and only the additional redundancy shut-off circuitry is described below.

To override the programming of the master fuse, inverter 218 of match fuse bank circuit 200 is replaced by a two input NOR gate 252 in match fuse bank circuit 250. Line 217 is provided to one of the inputs of NOR gate 252 and a redundancy control signal on a line 254 is provided to the other input of NOR gate 252. The state of the redundancy control signal on line 252 can be controlled external to the DRAM. For example, in one embodiment, the state of the redundancy control signal on line 252 defaults to a low logic level and is temporarily forced to a high logic level during testing, or is permanently forced to a high logic level by blowing a fuse. When the redundancy control signal on line 254 is low, NOR gate 252 functions as an inverter of the state provided in line 217. When the redundancy control signal on line 254 is high, the master signal from NOR gate 252 provided on line 220 is forced to a low level.

Thus, prior to programming of the fuses in match fuse bank circuit 250, line 254 is low and master fuse 210 is not blown, which causes a high level to be stored in master fuse read latch 212 which is inverted by NOR gate 252 to produce a low level master signal on line 220. With a low master signal on line 220, n-type transistor 208 is not activated. Prior to programming, fuses 202a–202d are also not blown. Thus, when a valid address is predecoded, three of the four predecoded address inputs a0&1(0–3) are low while one of the four predecoded address inputs corresponding to the predecoded binary value of address bits A0 and A1 is high. The sub-match signal on a line 222a is forced high by the activation of three of the p-type transistors 204a–204d corresponding to the three predecoded address inputs which are low.

Since programming match fuse bank circuit 250 involves blowing master fuse 210 and three of four fuses 202a–202d in each sub-match circuit 201, additional circuitry is provided to override the programming of the three of four fuses 202a–202d. A p-type transistor 256 has its source coupled to the power supply voltage and its drain coupled to line 222a into NOR gate 226. The master signal on line 220 is provided to the gate of p-type transistor 256. When the master signal on line 220 is high p-type transistor 256 is turned off. When the master signal on line 220 is low, such as when the redundancy control signal on line 254 is high, p-type transistor 256 is turned on to provide a high voltage level from the power supply voltage to line 222a. NOR gate 226 responds to the high level on line 222a to provide a low level on line 228 to disable redundancy.

A p-type transistor 258 is provided which has its source coupled to the power supply voltage and its drain coupled to the drain of n-type transistor 208 and the sources n-type transistors 206a–206d. P-type transistor 258 provides a high level to the node coupling the drain of transistor 208 to the sources of transistors 206a–206b when the master signal on line 220 is low to prevent the node from floating.

Thus, the user of the DRAM having match fuse bank circuit 250 according to the present invention can deactivate the match signal on line 228 to prevent access by the associated redundant row or column from external to the DRAM by forcing the redundancy control signal on line 254 to a high level. This redundancy disable feature permits the user of the DRAM according to the present invention to disable redundancy in certain test modes; when it is determined that the redundant circuit element is not functioning properly; or for any other suitable reason. This additional circuitry illustrated in FIG. 12 can also be employed in other embodiments of the present invention, such as in match fuse bank circuit 300 of FIG. 8 and match fuse bank circuit 400 of FIG. 9.

Conclusion

The present invention can be implemented with either non-predecoded or predecoded address inputs, and the number of fuses relative to the silicon area needed for the compare circuitry is variable depending on various design parameters such as attempting to minimize fanin requirements of the combination NOR gate to combine the sub-match signals to provide the overall match signal. The present invention as embodied in a DRAM or other integrated circuit comprising a match fuse bank circuit such as match fuse bank circuits 200, 300, and 400 provides a suitable scheme for replacing defective primary columns as well as defective primary rows with redundant circuit elements in significantly less silicon area then previous non-precharging match fuse bank circuits such as prior art non-precharging match fuse bank circuit 50.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An integrated circuit receiving n address bits and comprising:

primary circuit elements being selectable by binary values of the n address bits;

a programmable master storage device storing and providing a programmable master condition which when active indicates that at least one primary circuit element is being replaced; and redundant circuit elements, each having a corresponding matching circuit comprising:

a plurality of sub-match circuits, each including programmable two state storage devices being programmable to a programmed state wherein one of the two state storage devices is in a first of the two states and the rest of the two state storage devices are in a second of the two states, wherein each two state storage device corresponds to one of the possible binary values of at least one of the n address bits, and wherein each sub-match circuit is responsive to the master condition and a binary value of the at least one of the n address bits to activate a sub-match signal when the binary value of the at least one of the n address bits corresponds to the one of the two state storage devices in the first state and the master condition is active, each sub-match circuit includes redundancy disable circuitry responsive to a redundancy control signal being in a first state to deactivate an activated sub-match signal, and a match circuit coupled to the plurality of sub-match circuits for activating a match signal in response to all of the sub-match signals being active, wherein the activated match signal is used to disable a primary circuit element from being selected by a corresponding binary value of the n address bits and to enable the redundant circuit element to be selected by the corresponding binary value of the n address bits.

2. The integrated circuit of claim 1 wherein the redundancy control signal is controllable from external to the integrated circuit.

3. The integrated circuit of claim 1 wherein state of the redundancy control signal is capable of being temporarily changed to the first state.

4. The integrated circuit of claim 1 wherein the state of the redundance control signal is capable of being permanently changed to the first state.

5. The integrated circuit of claim 1 wherein the two state storage devices comprise fuses.

6. The integrated circuit of claim 1 wherein the integrated circuit is a dynamic random access memory (DRAM) comprising an array of memory cells arranged in rows and columns, and wherein the primary circuit elements comprise rows of memory cells.

7. The integrated circuit of claim 1 wherein the integrated circuit is a dynamic random access memory (DRAM) comprising an array of memory cells arranged in rows and columns, and wherein the primary circuit elements comprise columns of memory cells.

8. The integrated circuit of claim 1 wherein the integrated circuit is a dynamic random access memory (DRAM) comprising an array of memory cells arranged in rows and columns, and wherein the primary circuit elements comprise rows and columns of memory cells.

9. The integrated circuit of claim 1 wherein each sub-match circuit receives a predecoded form of at least two of the n address bits.

10. The integrated circuit of claim 1 wherein each sub-match circuit directly receives a true address bit and its compliment address bit.

11. The integrated circuit of claim 1 wherein the programmable master storage device comprises a fuse.

12. A method of replacing primary circuit elements with redundant circuit elements in an integrated circuit receiving n address bits, wherein the primary circuit elements are selectable by binary values of the n address bits, the method comprising the steps of:

programming a master storage device to a programmable master condition to indicate that at least one primary circuit element is being replaced;

in a redundant circuit element performing the steps of:

(a) programming two state storage devices to a programmed state wherein one of the two state storage devices is in a first of the two states and the rest of the two state storage devices are in a second of the two states, wherein each two state storage device corresponds to one of the possible binary values of at least one of the n address bits, (b) activating a plurality of sub-match signals, wherein each sub-match signal is activated in response to a binary value of the at least one of the n address bits corresponding to the one of the two state storage devices in the first state and the master condition being active, and (c) activating a match signal in response to all of the sub-match signals being active;

disabling a primary circuit element from being selected by a corresponding binary value of the n address bits based on an activated match signal;

enabling said redundant circuit element to be selected by the corresponding binary value of the n address bits; and deactivating at least one sub-match signal responsive to a redundancy control signal being in a first state to cause the match signal to be deactivated to thereby disable said enabled redundant circuit element from being selected by a corresponding binary value of the n address bits.

13. The method of claim 12 wherein the deactivating step includes the step of controlling the state of the redundancy control signal from external to the integrated circuit.

14. The method of claim 12 wherein the deactivating step includes the step of temporarily changing the state of the redundancy control signal to the first state.

15. The method of claim 12 wherein the deactivating step includes the step of permanently changing the state of the redundancy control signal to the first state.

16. The method of claim 12 wherein the programming two state storage devices step includes programming fuses.

17. The method of claim 12 wherein the method is performed in a dynamic random access memory (DRAM) comprising an array of memory cells arranged in rows and columns, and wherein the primary circuit elements comprise rows of memory cells.

18. The method of claim 12 wherein the method is performed in a dynamic random access memory (DRAM) comprising an array of memory cells arranged in rows and columns, and wherein the primary circuit elements comprise columns of memory cells.

19. The method of claim 12 wherein the method is performed in a dynamic random access memory (DRAM) comprising an array of memory cells arranged in rows and columns, and wherein the primary circuit elements comprise rows and columns of memory cells.

20. The method of claim 12 further comprising the step of predecoding at least two of the n address bits.

* * * * *